United States Patent
Shimomura et al.

(10) Patent No.: US 11,871,586 B2
(45) Date of Patent: Jan. 9, 2024

(54) MAGNETIC MEMORY

(71) Applicant: Kioxia Corporation, Tokyo (JP)

(72) Inventors: Naoharu Shimomura, Tokyo (JP);
Nobuyuki Umetsu, Kawasaki Kanagawa (JP); Tsuyoshi Kondo, Kawasaki Kanagawa (JP); Yoshihiro Ueda, Yokohama Kanagawa (JP); Yasuaki Ootera, Yokohama Kanagawa (JP); Akihito Yamamoto, Naka Kanagawa (JP); Mutsumi Okajima, Yokkaichi Mie (JP); Masaki Kado, Kamakura Kanagawa (JP); Tsutomo Nakanishi, Yokohama Kanagawa (JP); Michael Arnaud Quinsat, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 121 days.

(21) Appl. No.: 17/693,818

(22) Filed: Mar. 14, 2022

(65) Prior Publication Data
US 2023/0076828 A1 Mar. 9, 2023

(30) Foreign Application Priority Data
Sep. 3, 2021 (JP) .................................. 2021-144302

(51) Int. Cl.
G11C 19/08 (2006.01)
H10B 61/00 (2023.01)
(Continued)

(52) U.S. Cl.
CPC ............ *H10B 61/22* (2023.02); *G11C 11/161* (2013.01); *G11C 11/1675* (2013.01); *H10N 50/80* (2023.02); *G11C 19/08* (2013.01)

(58) Field of Classification Search
CPC .......................... G11C 19/0841; G11C 11/161
See application file for complete search history.

(56) References Cited

U.S. PATENT DOCUMENTS 7,626,844 B1 * 12/2009 Moriya ............... G11C 11/1673
 365/158
8,830,742 B2 * 9/2014 Kondo .................. G11C 11/161
 365/158

(Continued)

FOREIGN PATENT DOCUMENTS

EP 1 528 569 A2 5/2005
JP 5461683 B2 4/2014
(Continued)

*Primary Examiner* — Jason Lappas
(74) *Attorney, Agent, or Firm* — Finnegan, Henderson, Farabow, Garrett & Dunner, LLP (57) ABSTRACT

A magnetic memory of the present embodiment includes an electrode extending along a plane including a first direction and a second direction, a first wiring extending in the first direction, second wirings between the electrode and the first wiring, extending in the second direction and arranged in the first direction, first magnetic members each including a first part electrically connected to the first wiring and a second part electrically connected to the electrode, extending in a third direction, and being positioned between neighboring two of the second wirings when seen from the third direction, and a control circuit. When writing first information to one first magnetic member, the control circuit supplies first current to at least two second wirings positioned on one side of the one first magnetic member in the first direction.

16 Claims, 11 Drawing Sheets

(51) Int. Cl.
    *H10N 50/80*     (2023.01)
    *G11C 11/16*     (2006.01)

(56) References Cited

U.S. PATENT DOCUMENTS

| | | |
|---|---|---|
| 8,837,209 B2 | 9/2014 | Ohno et al. |
| 10,032,499 B2 | 7/2018 | Kado et al. |
| 11,101,012 B2 | 8/2021 | Ueda et al. |
| 2002/0154540 A1 | 10/2002 | Sekiguchi et al. |
| 2008/0225577 A1 | 9/2008 | Hosotani et al. |
| 2020/0303027 A1 | 9/2020 | Ueda et al. |
| 2021/0280635 A1 | 9/2021 | Tokuhira et al. |

FOREIGN PATENT DOCUMENTS

| | | |
|---|---|---|
| JP | 2017-143175 A | 8/2017 |
| JP | 2020-155178 A | 9/2020 |

\* cited by examiner

MAGNETIC MEMORY

CROSS REFERENCE TO RELATED APPLICATIONS

This application is based upon and claims the benefit of priority from the prior Japanese Patent Application No. 2021-144302, filed on Sep. 3, 2021, the entire contents of which are incorporated herein by reference.

FIELD

The embodiments of the present invention relate to a magnetic memory.

BACKGROUND

A magnetic memory in which magnetic domain wall displacement (shift) is caused in a magnetic member when current flows through the magnetic member is known. In this magnetic memory, information is written into the magnetic member by using a magnetic field generated by current flowing through a field line. There is a concern that the field line may be disconnected by electromigration due to large current flowing through the field line for writing of information.

DETAILED DESCRIPTION

Embodiments will now be explained with reference to the accompanying drawings. The present invention is not limited to the embodiments. It should be noted that the drawings are schematic or conceptual, and the relationship between the thickness and the width in each element and the ratio among the dimensions of elements do not necessarily match the actual ones. Even if two or more drawings show the same portion, the dimensions and the ratio of the portion may differ in each drawing. In the embodiments, "upper direction" or "lower direction" refers to a relative direction and may differ from an upper direction or lower direction based on a gravitational acceleration direction. In the present specification and the drawings, elements identical to those described in the foregoing drawings are denoted by like reference characters and detailed explanations thereof are omitted as appropriate.

A magnetic memory according to the present embodiment includes an electrode extending along a plane including a first direction and a second direction intersecting with the first direction, a first wiring extending in the first direction, a plurality of second wirings between the electrode and the first wiring, the plurality of second wirings extending in the second direction and arranged in the first direction, a plurality of first magnetic members provided corresponding to the first wiring, each of the first magnetic members including a first part electrically connected to the first wiring and a second part electrically connected to the electrode, extending from the first part toward the second part in a third direction intersecting with the first direction and the second direction, and being positioned between neighboring two of the plurality of second wirings when seen from the third direction, and a control circuit electrically connected to the electrode, the first wiring, and the plurality of second wirings, in which, when writing first information to one first magnetic member of the plurality of first magnetic members, the control circuit supplies first current to each of at least two wirings of the plurality of second wirings positioned on one side of the one first magnetic member in the first direction.

Hereinafter, some embodiments will be described below with reference to attached drawings.

Embodiment

Figure 1:
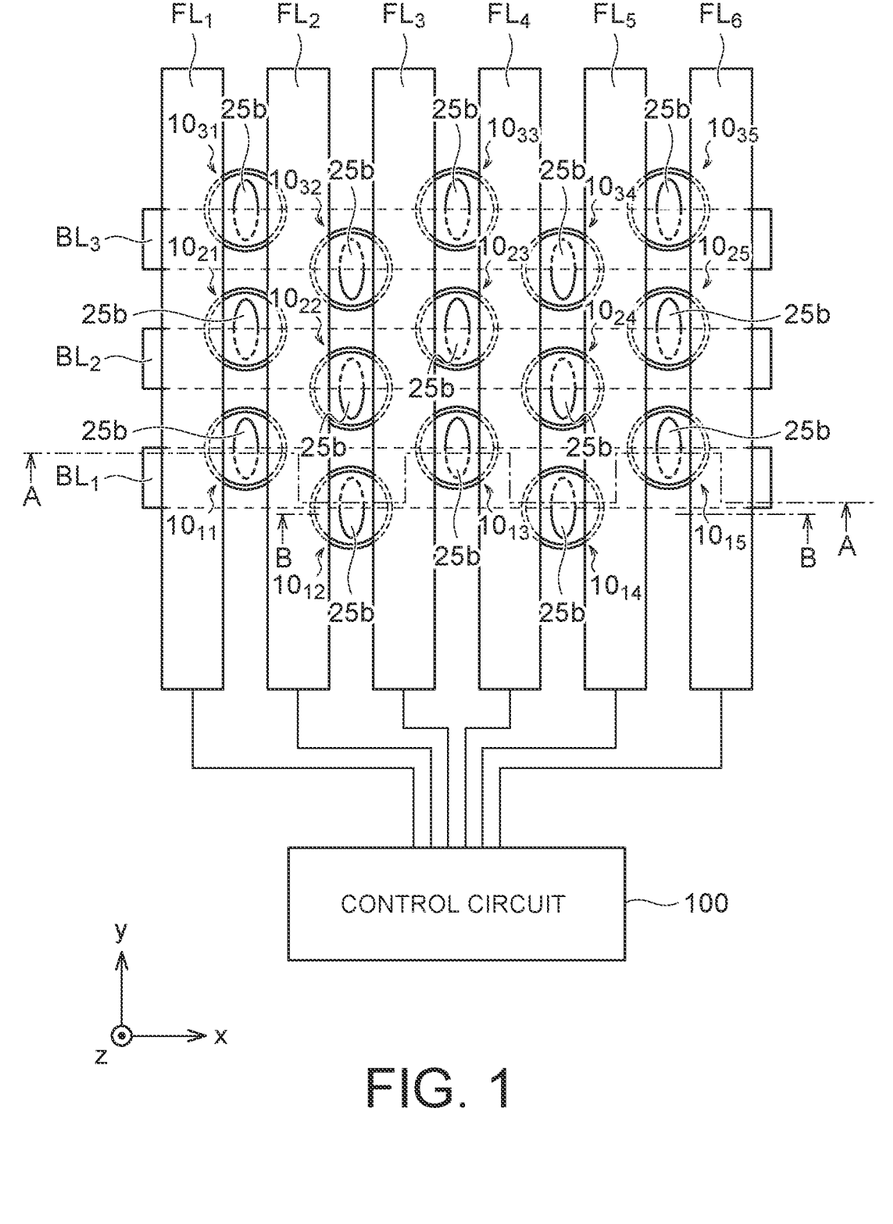
FIG. 1 is a plan view illustrating a magnetic memory according to an embodiment.
Figure 2:
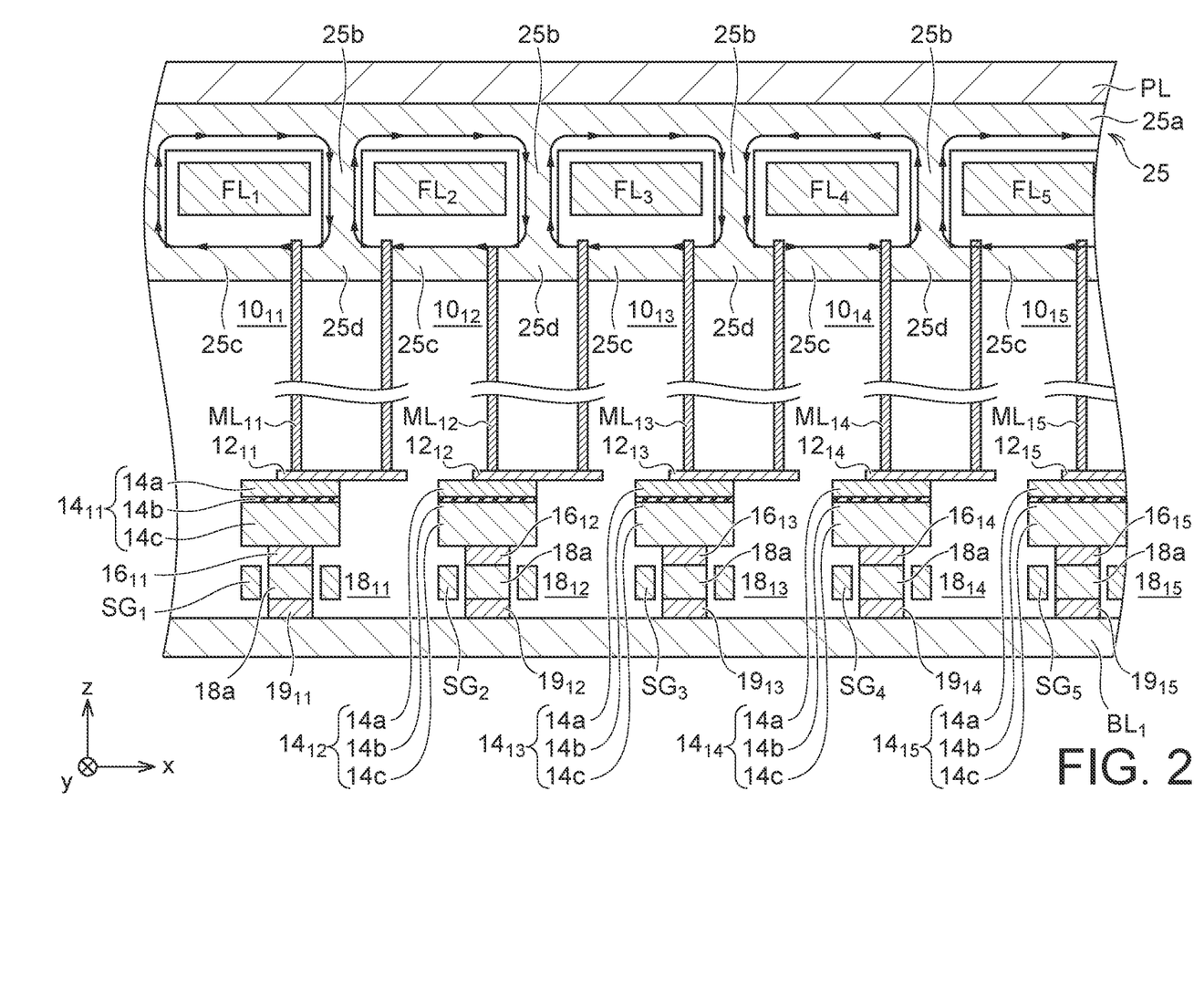
FIG. 2 is a cross-sectional view illustrating the magnetic memory, taken along a cutting plane line A-A illustrated in FIG. 1.

FIG. 1 is a plan view illustrating a magnetic memory according to an embodiment, and FIG. 2 illustrates a cross section taken along a cutting plane line A-A illustrated in FIG. 1. The magnetic memory of this embodiment includes memory units $10_{ij}$ (i=1, . . . , m, j=1, . . . , n) arranged in a matrix composed of m rows and n columns, when m and n are natural numbers. In FIG. 1, memory units $10_{11}$ to $10_{35}$ are arranged to form a matrix of 3 rows and 5 columns.

Memory units $10_{i1}$ to $10_{in}$ of the i-th (i=1, . . . , m) row are arranged along the bit line $BL_i$ extending in the x direction, and have one end electrically connected to the bit line $BL_i$. In the present specification, the expression "A and B are electrically connected" means that A and B may be directly connected or may be indirectly connected via an electric conductor. In the i-th (i=1, . . . , m) row, memory units $10_{i1}$, $10_{i3}$, . . . of odd-numbered columns and memory units $10_{i2}$, $10_{i4}$, . . . of even-numbered columns are arranged so as to be mutually offset in the up-and-down direction (y direction) on the paper. For example, the memory units $10_{i2}$ (i=1, . . . , m) of an even-numbered column are arranged between the memory units $10_{i1}$ and the memory units $10_{i3}$ so as to be offset downward on the paper. With such an arrangement, memory units can be arranged and integrated densely.

Two field lines $FL_j$ and $FL_{j+1}$ are provided for memory units $10_{i1}$, . . . , $10_{mj}$ arranged in the j-th (j=1, . . . , n) column. The field lines $FL_{j+1}$ (j=1, . . . , n−1) is arranged above a region between the memory units $10_{ij}$ (i=1, . . . , m) of the j-th column and the memory unit $10_{ij+1}$ of the (j+1)th column. Further, the field line $FL_{j+1}$ (j=1, . . . , n−1) may be arranged so as to be overlapped with a part of each of memory units $10_{ij}$ (i=1, . . . , m) in the j-th column and also overlapped with a part of each of memory units $10_{ij+1}$ (i=1, . . . , m) in the (j+1)th column.

For example, the field line $FL_2$ and the field line $FL_3$ are provided for the memory units $10_{i2}$ (i=1, . . . , m) arranged in the second column. The field line $FL_2$ is arranged above a region between the memory units $10_{i1}$ (i=1, . . . , m) of the first column and the memory units $10_{i2}$ of the second column. Further, the field line $FL_2$ may be arranged so as to be overlapped with a part of each of memory units $10_{i1}$ (i=1, . . . , m) of the first column and also overlapped with a part of each of memory units $10_{i2}$ (i=1, . . . , m) of the second column. Each field line $FL_j$ (j=1, . . . , n+1) extends in the y direction and intersects with each bit line $BL_i$ (i=1, . . . , m). Then, each field line $FL_j$ (j=1, . . . , n+1) is connected to and controlled by a control circuit 100. Further, each bit line $BL_i$ (i=1, . . . , m) is also connected to and controlled by the control circuit 100.

As illustrated in FIG. 2, a yoke 25a is arranged above the memory units $10_{ij}$ (i=1, . . . , m, j=1, . . . , n). The yoke 25a is arranged above all field lines $FL_1$ to $FL_{n+1}$. Further, a plate electrode PL electrically connected to the yoke 25a is arranged so as to contact an upper surface of the yoke 25a and cover the upper surface. Further, the plate electrode PL is connected to and controlled by the control circuit 100. For example, electrically conductive soft magnetic material (e.g., permalloy) or any materials including the electrically conductive soft magnetic material can be used as materials of the yoke 25a and below described yokes 25b, 25c, and 25d. Further, as another material of the yokes 25a, 25b, 25c, and 25d, any material having a granular structure in which magnetic particles are densely dispersed in an insulator matrix may be used. The yoke 25a may also serve as the plate electrode PL.

Each memory unit $10_{ij}$ (i=1, . . . , m, j=1, . . . , n), as illustrated in FIG. 2, includes a magnetic memory line (magnetic member) $ML_{ij}$ made of an electrically conductive magnetic material, a non-magnetic conductive layer $12_{ij}$, a magneto-resistive element $14_{ij}$, a non-magnetic conductive layer $16_{ij}$, a vertical thin film transistor $18_{ij}$, and a non-magnetic conductive layer $19_{ij}$.

Figure 3:
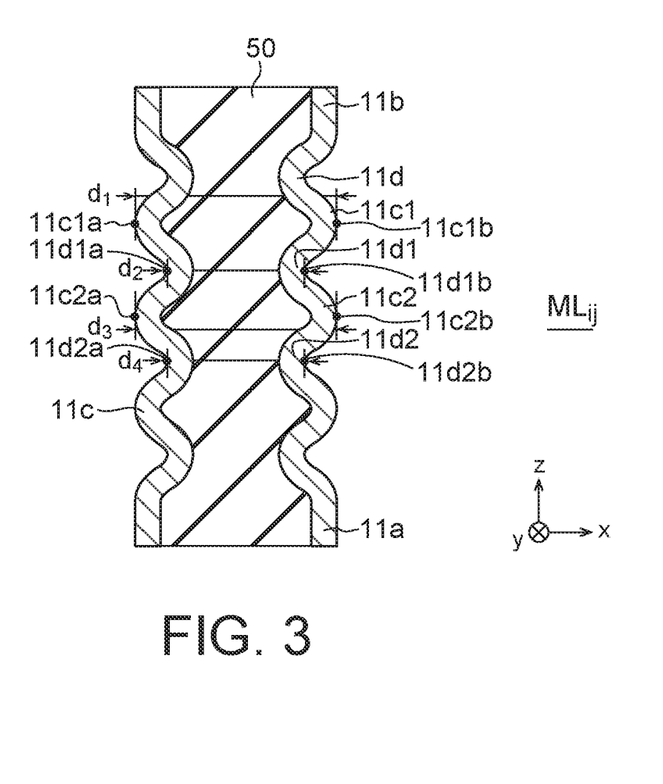
FIG. 3 is a cross-sectional view illustrating a magnetic member.

Each magnetic member $ML_{ij}$ (i, j=1, . . . , 4) is made of a vertical magnetic material extending in the up-and-down direction (z direction) in FIG. 2, and have a cylindrical shape. Each magnetic member $ML_{ij}$ (i, j=1, . . . , 4) may be provided with a non-magnetic insulator 50 in the cylinder, as illustrated in FIG. 3. That is, each magnetic member $ML_{ij}$ (i, j=1, . . . , 4) may be provided so as to surround the non-magnetic insulator 50. In the magnetic member $ML_{ij}$ (i=1, . . . , m, j=1, . . . , n), as illustrated in FIG. 3, a region 11c1, a neck 11d1, a region 11c2, and a neck 11d2 are arranged in the z direction. Let d1 be the length (diameter) between two ends 11c1a and 11c1b of the region 11c1 in the x direction, in a cross section cut along a plane parallel to the z direction of the region 11c1. Let d2 be the length (diameter) between two ends 11d1a and 11d1b of the neck 11d1 in the x direction, in a cross section cut along a plane parallel to the z direction of the neck 11d1. Let d3 be the length (diameter) between two ends 11c2a and 11c2b of the region 11c2 in the x direction, in a cross section cut along a plane parallel to the z direction of the region 11c2. Let d4 be the length (diameter) between two ends 11d2a and 11d2b of the neck 11d2 in the x direction, in a cross section cut along a plane parallel to the z direction of the neck 11d2. In this case, the conditions d1>d2, d4 and d3>d2, d4 are satisfied.

Further, in the magnetic member $ML_{ij}$ (i=1, . . . , m, j=1, . . . , n), a first end 11a (FIG. 3) is electrically connected to the magneto-resistive element $14_{ij}$ via the non-magnetic conductive layer $12_{ij}$. The non-magnetic conductive layer $12_{ij}$ (i=1, . . . , m, j=1, . . . , n) may be omitted. In this case, the first end 11a of the magnetic member $ML_{ij}$ (i=1, . . . , m, j=1, . . . n) is directly connected to the magneto-resistive element $14_{ij}$.

Further, in each magnetic member $ML_{ij}$ (i=1, . . . , m, j=1, . . . , n), a second end 11b (FIG. 3) is electrically connected to the yoke 25d. The yoke 25d and the yoke 25c are magnetically connected. Here, the expression "A is magnetically connected to B" means that A and B configure a magnetic circuit, and includes a case where magnetic materials are not in direct contact with each other. The yoke 25c is provided so as to face the yoke 25a, and the field lines $FL_1$, . . . , $FL_{n+1}$ are arranged between the yoke 25a and the yoke 25c. The yoke 25d is arranged at the center of the cylinder of each magnetic member $ML_{ij}$ (i=1, . . . , m, j=1, . . . , n), positioned on the same hierarchy as the yoke 25c, and magnetically connected to the yoke 25c. The yoke 25b is arranged between the yoke 25a and the yoke 25d, and is electrically connected to and also magnetically connected to the yoke 25a and the yoke 25d. Accordingly, the plate electrode PL is commonly electrically connected to each memory unit $10_{ij}$ (i=1, . . . , m, j=1, . . . , n).

Figure 4:
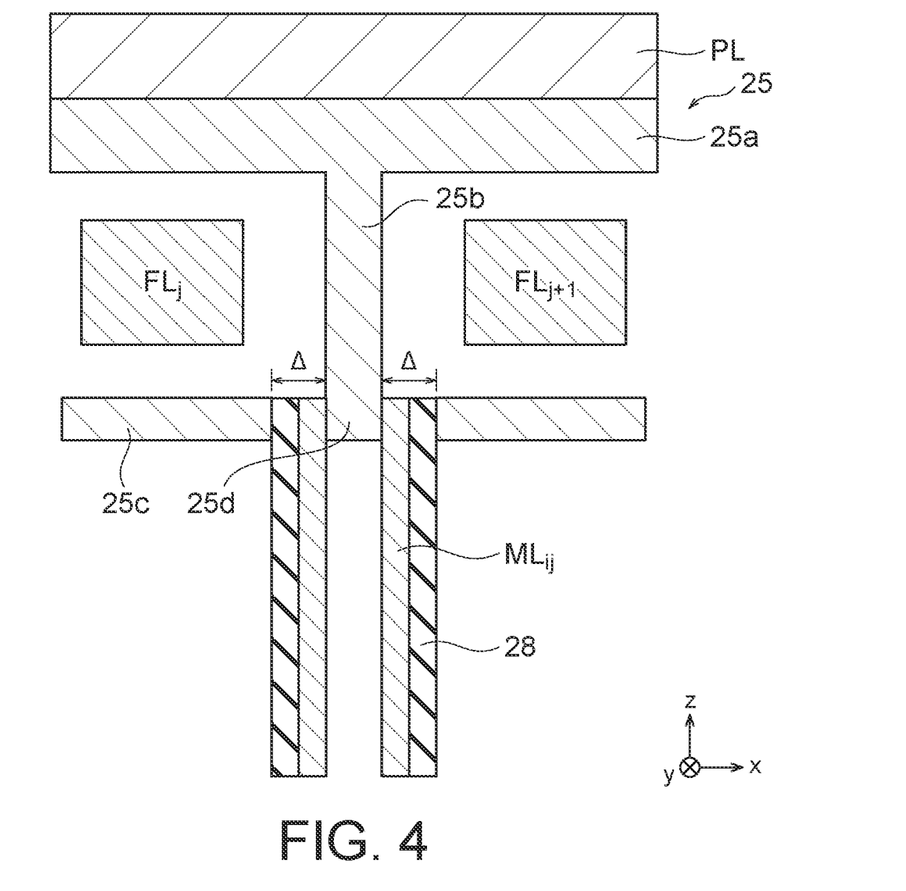
FIG. 4 is a cross-sectional view illustrating an exemplary magnetic gap.

The yoke 25a, the yoke 25b, the yoke 25c, and the yoke 25d configure a magnetic circuit 25. This magnetic circuit 25 is provided with a magnetic gap. For example, as illustrated in FIG. 4, the yoke 25b has one end connected to the yoke 25a and the other end connected to the yoke 25d. The yoke 25d is electrically connected to an inner surface of the upper end of the corresponding magnetic member $ML_{ij}$ (i=1, . . . , m, j=1, . . . , n). A non-magnetic insulation layer 28 is arranged on the outer surface of each magnetic member $ML_{ij}$ (i=1, . . . , m, j=1, . . . , n), and the yoke 25d is magnetically connected to the yoke 25c via the insulation layer 28. That is, in the case illustrated in FIG. 4, the sum of the thickness of each magnetic member $ML_{ij}$ (i=1, . . . , m, j=1, . . . , n) in the x direction and the thickness of the insulation layer 28 in the x direction is a magnetic gap Δ.

Figure 5:
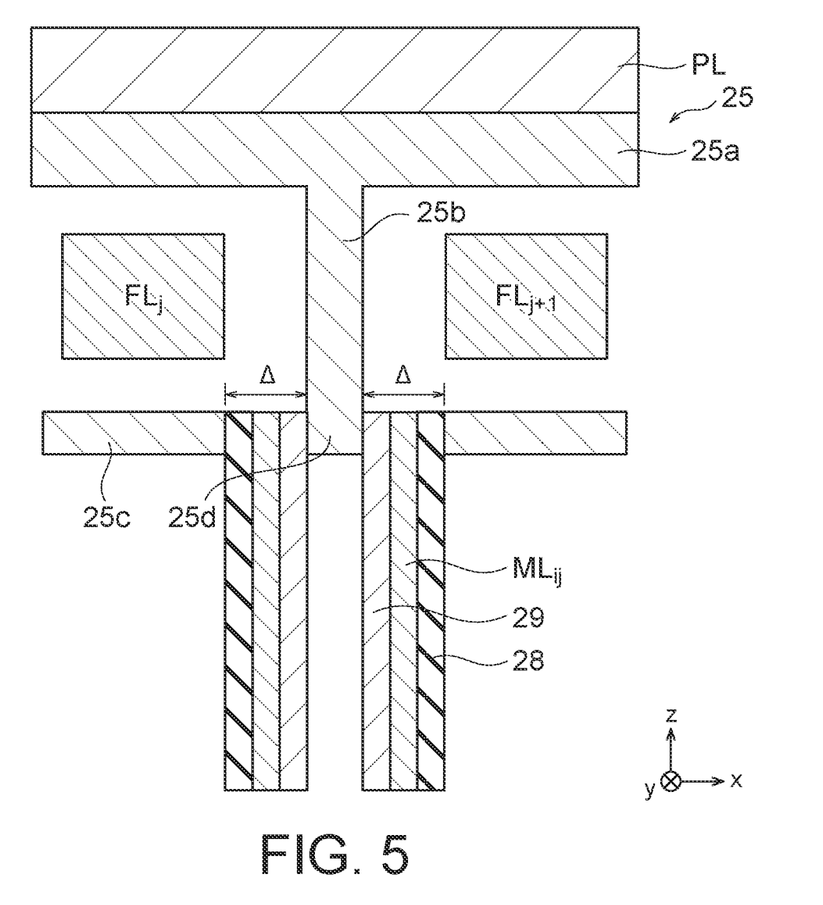
FIG. 5 is a cross-sectional view illustrating another exemplary magnetic gap.

Further, the magnetic gap of the magnetic circuit 25 can be obtained even when a configuration illustrated in FIG. 5 is adopted. In the case illustrated in FIG. 5, a non-magnetic conductive layer 29 is provided between each magnetic member $ML_{ij}$ (i=1, . . . , m, j=1, . . . , n) and the yoke 25d illustrated in FIG. 4. The non-magnetic conductive layer 29 is arranged so as to extend in the z direction on the inner surface of each magnetic member $ML_{ij}$ (i=1, . . . , m, j=1, . . . , n). In the case illustrated in FIG. 5, the magnetic gap Δ is the sum of the thickness of the non-magnetic conductive layer 29 in the x direction, the thickness of each magnetic member $ML_{ij}$ (i=1, . . . , m, j=1, . . . , n) in the x direction, and the thickness of the insulation layer 28 in the x direction. In FIGS. 4 and 5, the insulation layer 28 may be replaced by a non-magnetic conductive layer. Further, each magnetic member $ML_{ij}$ (i=1, . . . , m, j=1, . . . , n) may have a laminate structure including a magnetic layer (e.g., CoFeB) and an insulation layer (e.g., MgO). In this case, it is desirable to remove the insulation layer at the connection portion with the yoke 25d, so that the yoke 25d and the magnetic layer are brought into contact with each other for electrical connection. Since the MgO layer is an extremely thin layer, leak current may flow through this layer. Therefore, the MgO layer does not necessarily have to be removed.

Further, in the present embodiment, each magnetic member $ML_{ij}$ (i=1, . . . , m, j=1, . . . , n) is electrically connected to the yokes 25b and 25d, but instead may be electrically connected to the yoke 25c. In this case, it is desirable that the yoke 25c is electrically connected to the yoke 25a at another location. A non-magnetic layer may be provided between each magnetic member $ML_{ij}$ (i=1, . . . , m, j=1, . . . , n) and at least one of the yoke 25d and the yoke 25c. Further, each magnetic member $ML_{ij}$ (i=1, ..., m, j=1, ..., n) may be electrically connected to both of the yoke 25d and the yoke 25c. In this case, a non-magnetic conductive layer may be provided between each magnetic member $ML_{ij}$ (i=1, ..., m, j=1, ..., n) and at least one of the yokes 25d and 25c.

Returning to FIG. 2 again, the magnetic memory of the present embodiment will be described. The magneto-resistive element $14_{ij}$ (i=1, ..., m, j=1, ..., n) has a function of reading out information written in the magnetic member $ML_{ij}$. For example, a magnetic tunnel junction (MTJ) element is used. Hereinafter, the magneto-resistive element $14_{ij}$ (i=1, ..., m, j=1, ..., n) will be described as an MTJ element. The MTJ element $14_{ij}$ (i=1, ..., m, j=1, ..., n) includes a free layer (magnetization free layer) 14a whose magnetization direction is variable, a fixed layer (reference layer) 14c whose magnetization direction is fixed, and a non-magnetic insulation layer 14b arranged between the free layer 14a and the fixed layer 14c. In the MTJ element $14_{ij}$ (i=1, ..., m, j=1, ..., n), the free layer 14a is electrically connected to the first end 11a (FIG. 3) of the magnetic member $ML_{ij}$ via the corresponding non-magnetic conductive layer $12_{ij}$, and the fixed layer 14c is electrically connected to the corresponding vertical thin film transistor $18_{ij}$ via the corresponding non-magnetic conductive layer $16_{ij}$. Here, the expression "the magnetization direction is variable" means that the magnetization direction is variable depending on the leakage magnetic field from the corresponding magnetic member $ML_{ij}$ (i=1, ..., m, j=1, ..., n), in the reading operation described below. The expression "the magnetization direction is fixed" means that the magnetization direction does not change depending on the leakage magnetic field from the corresponding magnetic member $ML_{ij}$ (i=1, ..., m, j=1, ..., n).

The vertical thin film transistor $18_{ij}$ (i=1, ..., m, j=1, ..., n) includes a channel layer 18a having one end electrically connected to the fixed layer 14c of the magneto-resistive element $14_{ij}$ via the non-magnetic conductive layer $16_{ij}$ and the other end electrically connected to the bit line $BL_i$ via the non-magnetic conductive layer $19_{ij}$, and extending in the z direction, and a gate electrode part $SG_j$, arranged so as to surround or sandwich this channel layer 18a. That is, the gate electrode part $SG_j$, covers at least a part of the channel layer. The channel layer 18a is, for example, made of crystalline silicon. The gate electrode part $SG_j$ (j=1, ..., n) extends in the y direction and is connected to and controlled by the control circuit 100.

As illustrated in FIG. 2, the yokes 25a, 25b, 25c, and 25d are arranged so as to partly surround each of the field lines $FL_1$ to $FL_{n+1}$. For example, the yoke 25a is arranged so as to face the upper surface of each field line and covers this upper surface. The yoke (which may be referred to as a return yoke) 25c is arranged so as to face the lower surface of each field line 25c, and the yoke 25b connects the yoke 25a and the yoke 25d and is arranged on the side of each field line. The yoke 25a is arranged away from the upper surface of each field line, the yoke 25b is arranged away from the side surface of each field line, and the yoke 25c is arranged away from the lower surface of each field line.

(Writing Method)

Figure 6:
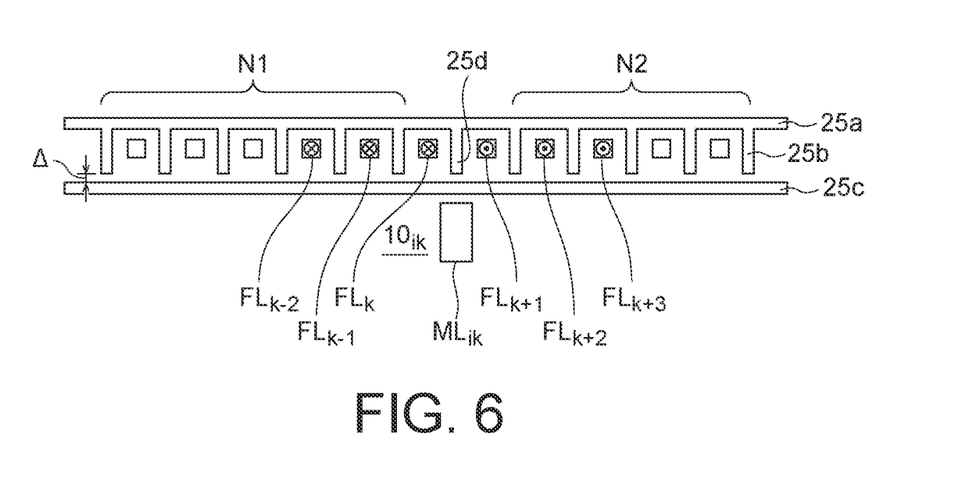
FIG. 6 is diagram illustrating a writing operation of the magnetic memory according to an embodiment.

Next, an exemplary writing method for the magnetic memory of the present embodiment will be described with reference to FIG. 6. FIG. 6 is a diagram illustrating an exemplary case where information is written to the magnetic member $ML_{ik}$ of the memory unit $10_{ik}$ in the i-th row and the k-th column, where i and k are positive integers. In this case, the writing is performed in such a manner that the writing current is divided and flows through a total of N1 field lines $FL_k$, $FL_{k-1}$, ..., $FL_{k-N1+1}$ positioned on the upper left side of the memory unit $10_{ik}$ and the writing current in the opposite direction is divided and flows through a total of N2 field lines $FL_{k+1}$, $FL_{k+2}$, ..., $FL_{k+N2-1}$ positioned on the right side of the memory unit $10_{ik}$. For example, the writing current flowing in the depth direction from the front is supplied to the N1 field lines $FL_k$, $FL_{k-1}$, ..., $FL_{k-N1+1}$, and the writing current flowing from the back to the front is supplied to the N2 field lines $FL_{k+1}$, $FL_{k+2}$, ..., $FL_{k+N2-1}$.

Figure 7:
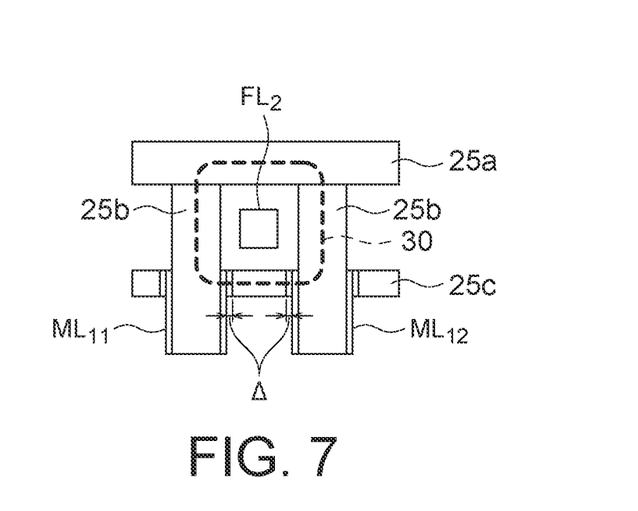
FIG. 7 is a diagram illustrating a writing operation in the case of no division of current.

Next, the feasibility of the writing operation even in the case of distributing the writing current into field lines will be described with reference to FIGS. 7 and 8. FIG. 7 is a schematic diagram illustrating a case where the writing is performed by causing the writing current, e.g., 2 mA, to flow through the field line $FL_2$ illustrated in FIG. 2. In this case, the yoke 25b on the magnetic member $ML_{11}$, the yoke 25a, the yoke 25b on the magnetic member $ML_{12}$, and the yoke 25c between the magnetic member $ML_{12}$ and the magnetic member $ML_{11}$ form a magnetic circuit 30 indicated by a dotted line in FIG. 7. In this magnetic circuit 30, the magnetic gap Δ is provided between the yoke 25c and magnetic member $ML_{11}$, and the magnetic gap Δ is provided between the yoke 25c and the magnetic member $ML_{12}$. Assuming that the length of each magnetic gap Δ is L and the current value through the magnetic circuit 30 is I, the magnetic field strength H in these magnetic gaps Δ is H=I/(2L) according to Ampere's law. In FIG. 7, H=2 mA/(2L) since I=2 mA. In this case, it is assumed that the magnetic resistance of yokes 25a, 25b, and 25c in the magnetic circuit 30 is zero.

Figure 8:
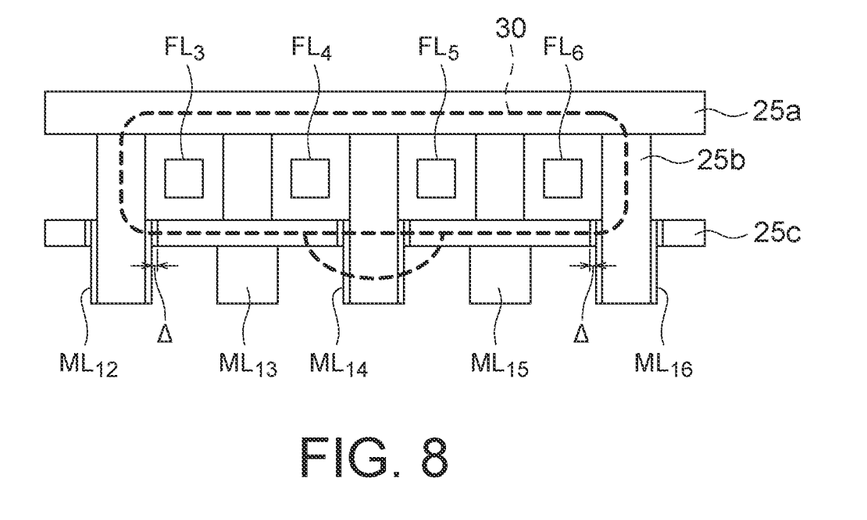
FIG. 8 is a diagram illustrating a writing operation in the case of dividing the current.

On the other hand, FIG. 8 is a schematic diagram in the case where the writing current is divided and supplied to four field lines. FIG. 8 corresponds to the cross section taken along a cutting plane line B-B illustrated in FIG. 1. In FIG. 8, the yoke 25b on the magnetic member $ML_{12}$, the yoke 25a, the yoke 25b on the magnetic member $ML_{16}$, and the yoke 25c form the magnetic circuit 30 indicated by a dotted line in FIG. 8. In this magnetic circuit 30, the magnetic gap Δ is provided between the yoke 25c and the magnetic member $ML_{12}$, and the magnetic gap Δ is provided between the yoke 25c and the magnetic member $ML_{16}$. It seems that a magnetic gap is provided between the magnetic member $ML_{14}$ and the yoke 25c, but the connection of the yoke 25c is continuous as understood from FIG. 1 and the magnetic circuit 30 is formed by bypassing the outer periphery of the magnetic member $ML_{14}$. Therefore, no magnetic gap is generated between the magnetic member $ML_{14}$ and the yoke 25c. Regarding the magnetic field strength H in the magnetic gap in the case illustrated in FIG. 8, when the length of each magnetic gap Δ is L and the current value through the magnetic circuit 30 is I, the magnetic field strength H in these magnetic gaps Δ is H=I/(2L) according to Ampere's law. In FIG. 8, H=2 mA/(2L) since I=0.5 mA×4=2 mA. That is, the magnetic field strength in the magnetic gap Δ is the same as the case illustrated in FIG. 7. This means that, even when the writing current is distributed to field lines, the writing operation can be performed in the same manner as in the case of no distribution of the current.

In the present embodiment, the writing operation is performed by supplying the writing current to the field line positioned on the upper left side of the memory unit for writing information, and supplying the writing current of opposite direction to the field line positioned on the upper right side of the memory unit. Performing this writing operation can avoid saturation in the yokes, which will be described with reference to FIG. 9A to FIG. 10B.

Figure 9A:
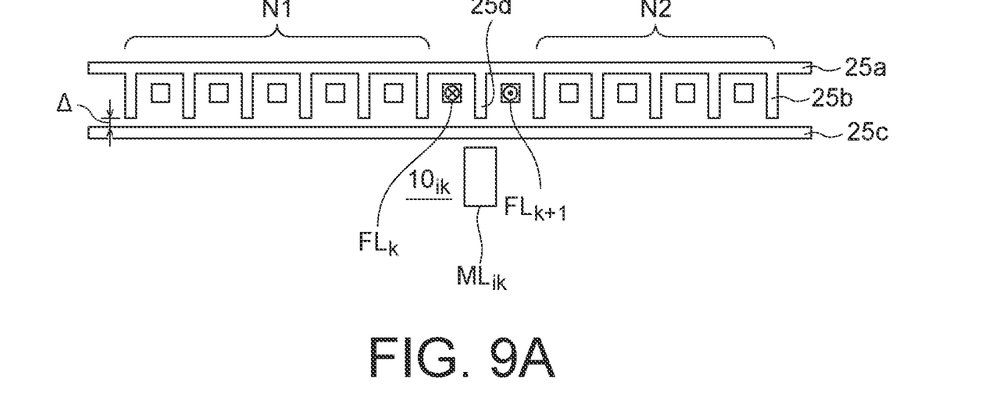
FIGS. 9A and 9B are diagrams illustrating a writing operation for avoiding saturation in yokes.
Figure 9B:
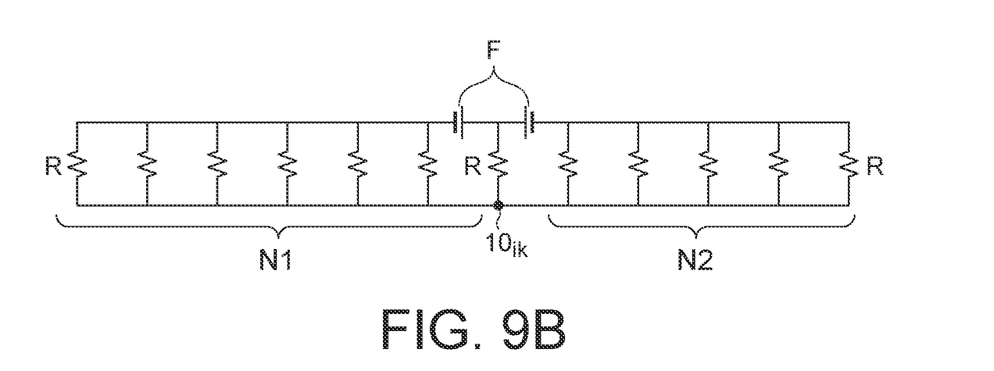

FIG. 9A is a schematic diagram in the case where the writing current flowing through the field line $FL_k$ and the writing current flowing through the field line $FL_{k+1}$ are identical in magnitude but different in direction and no writing current flows across other field lines in FIG. 6. FIG. 9B illustrates the magnetic circuit in this case. Since the writing current flowing through the field line $FL_k$ and the writing current flowing through the field line $FL_{k+1}$ are identical in magnitude but different in direction, magnetomotive forces F that are mutually opposite in direction are generated on the left and right sides of the writing memory unit $10_{ik}$. Since the magnetic gap Δ is provided between each yoke 25b and the return yoke 25c, the magnetic gap Δ serves as a magnetic resistance R.

In FIG. 9B, in a left-side circuit of the writing memory unit $10_{ik}$, since N1 magnetic resistances R are connected in parallel, the combined magnetic resistance is R/N1. In a right-side circuit of the writing memory unit $10_{ik}$, since N2 magnetic resistances R are connected in parallel, the combined magnetic resistance is R/N2. That is, the magnetic circuit illustrated in FIG. 9B is represented by an equivalent magnetic circuit illustrated in FIG. 10A. In this equivalent magnetic circuit, the two magnetomotive forces F are connected in parallel.

Figure 10A:
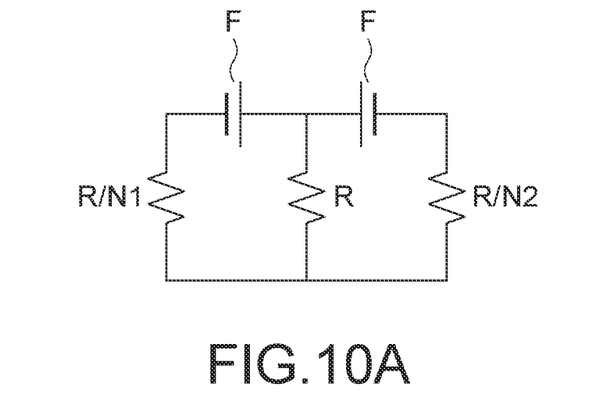
FIGS. 10A and 10B are diagram illustrating a writing operation for avoiding saturation in yokes.

In FIG. 10A, assuming that N1 and N2 are large, the combined resistances R/N1 and R/N2 are smaller than the magnetic resistance R in the writing memory unit $10_{ik}$, and a magnetic flux φ flowing through the yoke 25 due to the magnetomotive force F is F/R.

Figure 10B:
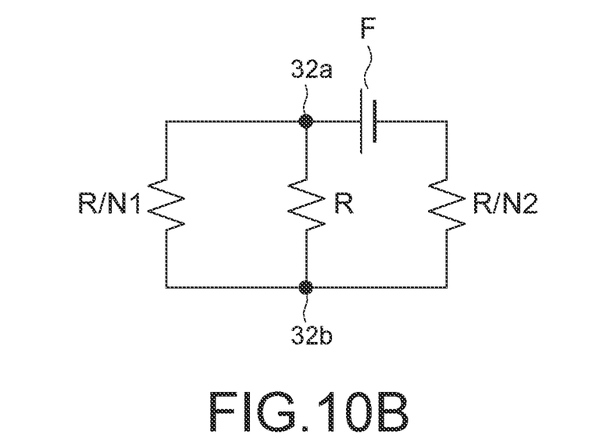

On the other hand, FIG. 10B illustrates an equivalent magnetic circuit in a case where, in FIG. 9A, the writing current is supplied to the field line $FL_{k+1}$ and the writing current is not supplied to other field lines. Even in this FIG. 10B, the combined resistances R/N1 and R/N2 are smaller than the magnetic resistance R of the yoke 32, and the magnetomotive force F is not provided in the left-side magnetic circuit. Therefore, it is close to a state in which two terminals 32a and 32b of the magnetic resistance R in the writing memory unit $10_{ik}$ are almost short-circuited. Therefore, an extremely large magnetic flux φ flows through the yoke corresponding to the writing memory unit $10_{ik}$, and magnetic saturation occurs in the magnetic resistance R.

On the other hand, as in the present embodiment, for example, as illustrated in FIG. 9A, it is possible to suppress the occurrence of magnetic saturation by supplying the writing currents identical in magnitude but different in direction on both sides of the yoke corresponding to the writing memory unit.

Figure 11:
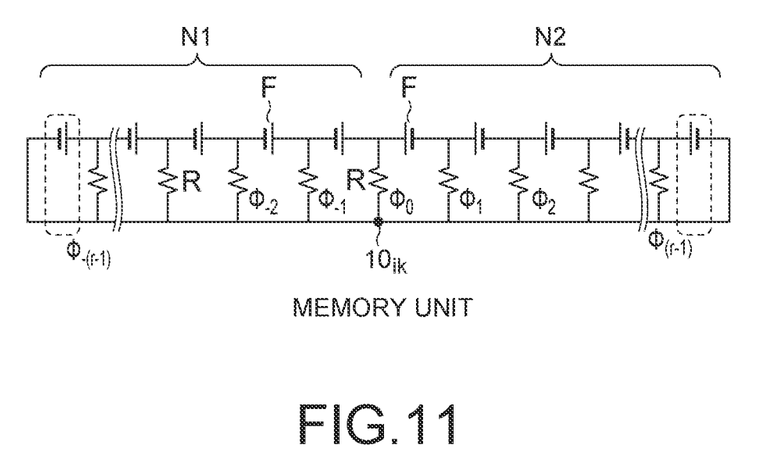
FIG. 11 is a diagram illustrating an estimation of magnetic flux in writing of the magnetic memory according to an embodiment.

Next, in the magnetic memory illustrated in FIG. 6, the magnetic flux generated when the divided writing currents mutually different in direction are supplied to each of r (<N1, N2) field lines on both sides of the writing memory unit will be described with reference to FIG. 11. FIG. 11 is a magnetic circuit diagram in this case. Let $φ_0$ be the magnetic flux generated in the magnetic gap corresponding to the writing memory unit $10_{ik}$. Let $φ_{-j}$ be the magnetic flux generated in the magnetic gap corresponding to j (j=1, . . . , r−1)th memory unit on the left side of the writing memory unit $10_{ik}$. Let $φ_j$ be the magnetic flux generated in the magnetic gap corresponding to the j (j=1, . . . , r−1)th memory unit on the right side of the writing memory unit $10_{ik}$. In this case, these magnetic fluxes satisfy the following relationship.

$φ_{-(r-1)}=φ_{r-1}=F/R$,
$φ_{-(r-2)}=φ_{r-2}=2F/R$,
. . . , and
$φ_0=rF/R$

In this case, the magnetic flux density is highest in the yoke in an outermost region (a region indicated by a dotted line in FIG. 11) where the writing current flows. The magnetic flux flowing through this region is as follows.

$$\sum_{n=1}^{r-1} φ_n + \frac{φ_0}{2} = \frac{r^2 F}{2R}$$ [expression 1]

The ratio of the magnetic flux in the above-described region to the magnetic flux $φ_0$ flowing through the writing memory unit is as follows.

$$\frac{\frac{r^2 F}{2R}}{\frac{rF}{R}} = \frac{r}{2}$$ [expression 2]

The upper limit of the above-described ratio varies greatly depending on the film thickness, magnetic characteristics, or the like of the yoke. In FIG. 11, the combined magnetic resistance of the memory unit in the region outside the region where the magnetic flux density is highest is R/(N1−r) on the left side of the writing memory unit and R/(N2−r) on the right side. Assuming N1, N2>>r, the above-described combined magnetic resistance can be regarded as substantially zero.

Figure 12A:
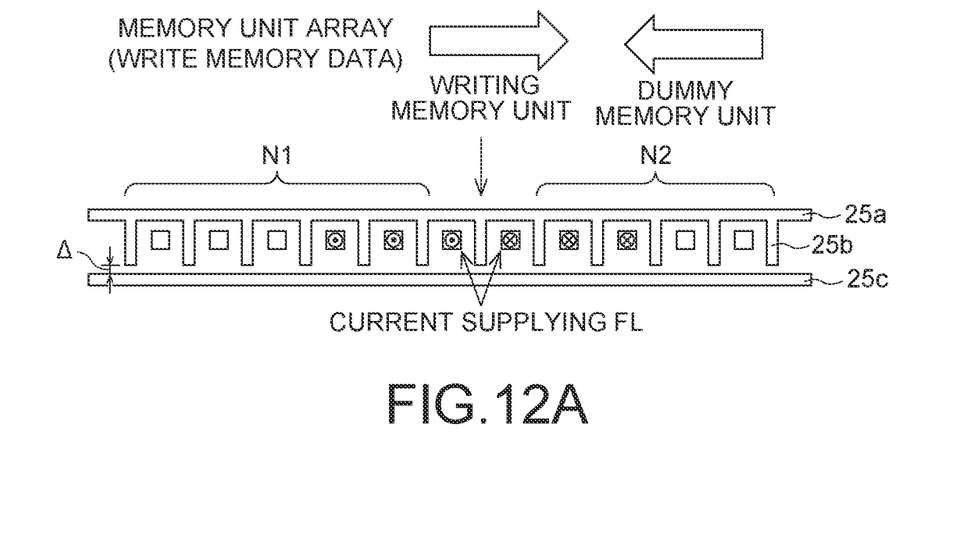
FIGS. 12A and 12B are diagrams illustrating a writing operation at an end of a memory unit array.
Figure 12B:
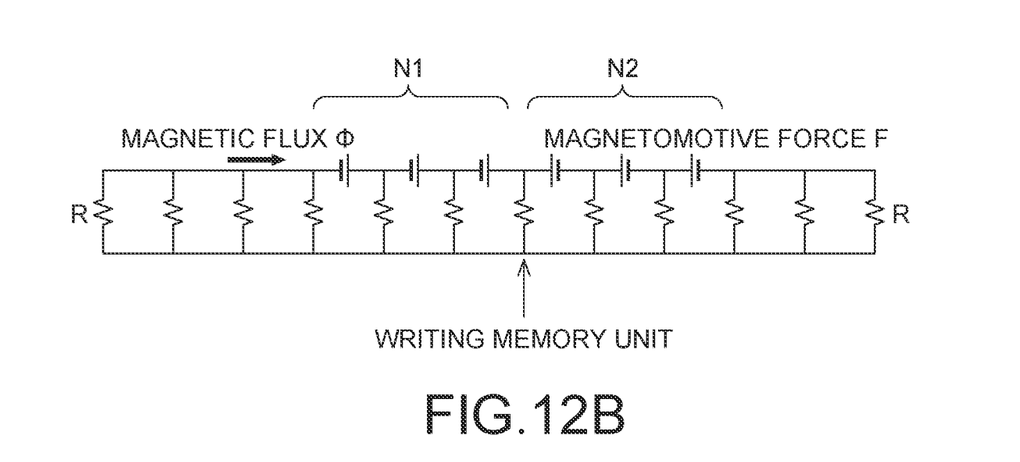

Next, the writing to the memory unit at the end of the memory unit array will be described with reference to FIGS. 12A and 12B. FIG. 12A is a diagram illustrating a writing operation at the end of the memory unit array, and FIG. 12B is a diagram illustrating an equivalent magnetic circuit with respect to FIG. 12A. In the configuration of the present embodiment, a dummy memory unit array is provided outside the memory unit array for writing to the memory unit at the end. The writing to the memory unit at the end includes, as illustrated in FIGS. 12A and 12B, supplying the writing current flowing from the back in the depth direction on the paper to r field lines on the left side of this memory unit, for example, and supplying the writing current flowing from the front in the depth direction on the paper to r field lines (the field lines corresponding to memory unit included in the memory unit array or in the dummy memory unit array) on the right side of the above-described end memory unit, for example. The writing current flowing through the r field lines on the right side of the memory unit into which the information is written and the writing current flowing through the r field lines on the left side are identical in magnitude but different in direction. In this manner, the writing can be performed at the end of the memory unit array.

Assuming that r is the number of field lines through which the writing current flows of the field lines positioned on one side of the memory unit for writing, it is desirable that the number of columns of the dummy memory units to be provided is at least r.

Further, the dummy memory units are provided with the yoke 25a, the return yoke 25c, and the field lines FL illustrated in FIG. 6. However, the dummy memory units may or may not be provided with the magnetic members ML. The magnetic member ML, if it is provided, may not be electrically connected to at least one of the plate electrode PL and bit line BL. It is desirable to maintain the symmetry with respect to the writing memory units in a region combining the memory unit region and the dummy memory unit region. Therefore, it is desirable that the dummy memory units are provided with the yoke 25b and the yoke 25d as well.

Further, in the case of providing dummy memory units of r columns or more, it is not necessary to provide the field line outside the (r+1)th column.

Further, a cell may be provided in which the yoke 25a and the return yoke 25c outside from the (r+1)th column illustrated in FIG. 6 are in contact with each other, that is, the magnetic gap is eliminated and the magnetic resistance is reduced to zero. Instead of eliminating the magnetic gap, the ends of the yoke 25a and the return yoke 25c may be electrically connected. As a result, the magnetic resistances on both sides of the writing memory unit become the same at the time of writing. This is because, in FIG. 12B, the combined magnetic resistance of the memory units outside the (r+1)th columns on the left side of the writing memory unit is substantially zero.

As described above, in the present embodiment, the writing to a memory unit includes supplying the field lines of r columns on both sides of the writing memory unit with divided writing currents that are opposite in direction. Further, the writing to a memory unit at the end of a memory unit array includes supplying the field lines of r columns on both sides of the writing memory unit including dummy cells with divided writing currents that are opposite in direction. As a result, the writing can be performed even when the magnitude of the current flowing through one field line is reduced, and it is possible to suppress the occurrence of electromigration in the field line and it is possible to suppress the occurrence of disconnection.

In the case of performing the writing to the memory unit, it suffices if writing current I1 flowing through each field line of r1 columns on the left side of the writing memory unit and writing current I2 flowing through each field line of r2 column on the right side satisfy the relationship I1×r1=I2×r2. When the above relationship is satisfied, the same magnetic field is applied to the writing memory unit from the left and right. Although the same magnetic field may not necessarily be applied from the left and right, it is desirable to apply the same magnetic field to the writing memory unit from the left and right in order to avoid saturation in the magnetic material.

In the present embodiment, in one writing operation, one piece of information, for example, information "1", is written to the memory units arranged in one column at the same time. For example, assuming that k represents a natural number of n or less, the information "1" is written in m memory units $10_{1k}$ to $10_{mk}$ arranged in the k-th column. Subsequently, for the memory unit (e.g., the memory unit $10_{2jk}$ in the even-numbered row) in which the information "1" is to be stored, the shift current is selectively supplied between the plate electrode PL and the bit line $BL_{2j}$; corresponding to the memory unit that stores the above-described information "1", thereby causing the above-described information to move to the magneto-resistive element side. As a result, the information "1" is stored. Here, j is a natural number not less than 1 and not greater than m/2. After that, information "0" is written to the memory units arranged in the k-th column. Subsequently, the shift current is selectively supplied to memory units other than the memory unit storing the information "1", for example, the memory units in the odd-numbered rows in the k-th column, thereby enabling the shifting to the magneto-resistive element side. Through the above two operations, the writing of information to the memory unit arranged in the k-th column is completed. In a single writing operation, one piece of information is written into each of memory units arranged in one column at the same time, so that writing power consumption per bit can be reduced.

(Reading Method)

Next, a reading method will be described. In the case of reading information from the memory unit, for example, in the case of reading information from the memory unit $10_{12}$, when the information to be read is positioned at the lowermost part of the magnetic member $ML_{12}$ of the memory unit $10_{12}$, that is, positioned in a region closest to the MTJ element $14_{12}$, the magnetization direction of the free layer 14a of the MTJ element $14_{12}$ also changes according to the information stored in the lowermost part of the magnetic member $ML_{12}$. Therefore, the information is read from the MTJ element $14_{12}$ by supplying the reading current between the plate electrode PL and the bit line $BL_1$, using the control circuit 100. The reading information in this case corresponds to the resistive state of the MTJ element $14_{12}$. For example, compared to the case where the resistance is low, the case where the resistance of the MTJ element $14_{12}$ is high corresponds to a state in which the magnetization directions in the free layer 14a and the fixed layer 14c of the MTJ element $14_{12}$ are closer to antiparallel (e.g., 90 degrees or more). Compared to the case where the resistance is high, the case where the resistance of the MTJ element $14_{12}$ is low corresponds to a state in which the magnetization directions in the free layer 14a and the fixed layer 14c of the MTJ element $14_{12}$ are closer to parallel (e.g., 90 degrees or less).

When the information to be read is not present in the lowermost part of magnetic member $ML_{12}$ of the memory unit $10_{12}$, the shift current is supplied between the plate electrode PL and the bit line BL1, using the control circuit 100, thereby causing the information to be read to move so as to be positioned at the lowermost part of the magnetic member $ML_{12}$. After that, the information can be read by performing the above-mentioned reading operation.

As described above, according to the present embodiment, the writing current flowing through a single field line can be reduced by performing the writing with the writing current divided for field lines. Thereby, the occurrence of disconnection due to electromigration can be suppressed. Further, the writing of information into memory units can be performed by a single writing operation, and the writing power consumption can be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
   an electrode extending along a plane including a first direction and a second direction intersecting with the first direction;
   a first wiring extending in the first direction;
   a plurality of second wirings between the electrode and the first wiring, the plurality of second wirings extending in the second direction and arranged in the first direction;
   plurality of first magnetic members provided corresponding to the first wiring, each of the first magnetic members including a first part electrically connected to the first wiring and a second part electrically connected to the electrode, extending from the first part toward the second part in a third direction intersecting with the first direction and the second direction, and being positioned between neighboring two of the plurality of second wirings when seen from the third direction; and a control circuit electrically connected to the electrode, the first wiring, and the plurality of second wirings, wherein, when writing first information to one first magnetic member of the plurality of first magnetic members, the control circuit supplies first current to each of at least two wirings of the plurality of second wirings positioned on one side of the one first magnetic member in the first direction.

2. The magnetic memory according to claim 1, wherein when writing the first information to the one first magnetic member, second current that is different in direction from the first current is supplied to at least one wiring of the plurality of second wirings positioned on the other side of the one first magnetic member in the first direction.

3. The magnetic memory according to claim 2, wherein the at least one wiring is a plurality of wirings.

4. The magnetic memory according to claim 1, comprising a second magnetic member connected to the electrode, extending along the plane, and arranged between the electrode and the plurality of second wirings, a third magnetic member extending along the plane, wherein the plurality of second wirings are positioned between the second magnetic member and the third magnetic member, a plurality of fourth magnetic members between the second magnetic member and the third magnetic member, the plurality of fourth magnetic members corresponding to the plurality of first magnetic members and extending in the third direction, a non-magnetic member arranged at least either between one of the fourth magnetic members and the second part of correspond one of the first magnetic members or between the second part of the correspond one and the third magnetic member, wherein at least either the one of the fourth magnetic members or the third magnetic member is electrically connected to the second part.

5. The magnetic memory according to claim 2, wherein $k1 \times I1 = k2 \times I2$ is satisfied, where I1 is the absolute value of the magnitude of the first current, I2 is the absolute value of the magnitude of the second current, k1 is the number of the second wirings positioned on the one side of the one first magnetic member in the first direction, and k2 is the number of the second wirings positioned on the other side.

6. The magnetic memory according to claim 5, wherein k1=k2.

7. The magnetic memory according to claim 3, wherein the second wirings supplied with the first currents are positioned so as to be adjacent to each other, and the second wirings supplied with the second currents are positioned so as to be adjacent to each other.

8. The magnetic memory according to claim 1, wherein positions of neighboring first magnetic members of the plurality of first magnetic members in the second direction are mutually different.

9. The magnetic memory according to claim 4, wherein a first insulation layer is provided between each of the plurality of first magnetic members and the third magnetic member.

10. The magnetic memory according to claim 4, wherein a non-magnetic conductive layer is provided between each of the plurality of first magnetic members and corresponding one of the plurality of fourth magnetic members.

11. The magnetic memory according to claim 1, further comprising a plurality of magneto-resistive elements each provided corresponding to each of the plurality of first magnetic members, the plurality of magneto-resistive elements each including a first terminal and a second terminal, the first terminal electrically connected to the first part of the corresponding first magnetic member, and a plurality of transistors each provided corresponding to each of the plurality of magneto-resistive elements, the plurality of transistors each including a channel layer extending in the third direction and a gate electrode part covering at least a part of the channel layer, one end of the channel layer electrically connected to the second terminal of the corresponding magneto-resistive element, and the other end of the channel layer electrically connected to the first wiring, wherein the gate electrode part is electrically connected to the control circuit.

12. The magnetic memory according to claim 1, wherein the plurality of first magnetic members have cylindrical shape.

13. The magnetic memory according to claim 1, further comprising a non-magnetic insulator part that extends in the third direction and is surrounded by one of the plurality of first magnetic members, wherein one of the plurality of first magnetic members includes third to sixth parts arranged between the first part and the second part in the third direction and each surrounding the non-magnetic insulator part, the fourth part is positioned between the third part and the sixth part, the fifth part is positioned between the fourth part and the sixth part, and in a cross section extending in the third direction and including the first magnetic member and the non-magnetic insulator part, when the length between a first end and a second end of the third part in a direction perpendicular to the third direction is a first distance, the length between a third end and a fourth end of the fourth part in the direction perpendicular to the third direction is a second distance, the length between a fifth end and a sixth end of the fifth part in the direction perpendicular to the third direction is a third distance, and the length between a seventh end and an eighth end of the sixth part in the direction perpendicular to the third direction is a fourth distance, the first distance and the third distance are greater than the second distance and the fourth distance.

14. The magnetic memory according to claim 1, wherein two neighboring second wirings of the plurality of second wirings and the first magnetic member positioned between the two neighboring second wirings are partly overlapped with each other when seen from the third direction.

15. The magnetic memory according to claim 4, wherein the second magnetic member and the third magnetic member are electrically connected to each other at ends on one side in the first direction, and also electrically connected to each other at the other ends.

16. The magnetic memory according to claim 4, wherein a magnetic gap is provided between the fourth magnetic members and the third magnetic member.

\* \* \* \* \*

UNITED STATES PATENT AND TRADEMARK OFFICE
CERTIFICATE OF CORRECTION

PATENT NO. : 11,871,586 B2
APPLICATION NO. : 17/693818
DATED : January 9, 2024
INVENTOR(S) : Naoharu Shimomura et al.

It is certified that error appears in the above-identified patent and that said Letters Patent is hereby corrected as shown below:

In the Claims

Claim 5, Column 11, Line 48, "$k1 \times I1 = k2 \times 12$" should read as --$k1 \times I1 = k2 \times I2$--.

Signed and Sealed this
Twenty-eighth Day of May, 2024

Katherine Kelly Vidal
*Director of the United States Patent and Trademark Office*